US006851955B2

(12) United States Patent
Chen

(10) Patent No.: US 6,851,955 B2
(45) Date of Patent: Feb. 8, 2005

(54) ASSEMBLY STRUCTURE OF ADAPTER HAVING CONDUCTIVE TERMINAL WITH METAL EXTENDING PORTION FOR CONDUCTING WITH PCB

(75) Inventor: Chun-Chen Chen, Taipei (TW)

(73) Assignee: Delta Electronics, Inc., Taipei (TW)

( * ) Notice: Subject to any disclaimer, the term of this patent is extended or adjusted under 35 U.S.C. 154(b) by 0 days.

(21) Appl. No.: 10/431,470

(22) Filed: May 8, 2003

(65) Prior Publication Data

US 2004/0110397 A1 Jun. 10, 2004

(30) Foreign Application Priority Data

Dec. 10, 2002 (TW) ....................................... 91135748 A

(51) Int. Cl.$^{7}$ ........................... H01R 12/00; H05K 1/00
(52) U.S. Cl. ......................................... 439/76.1; 439/84
(58) Field of Search ........................... 439/76.1, 59, 62, 439/84, 76

(56) References Cited

U.S. PATENT DOCUMENTS 6,116,961 A * 9/2000 Henneberger et al. ...... 439/668
6,371,796 B2 * 4/2002 Fukuda ....................... 439/489
6,375,508 B1 * 4/2002 Pickles et al. ............. 439/608

* cited by examiner

*Primary Examiner*—Chandrika Prasad
(74) *Attorney, Agent, or Firm*—Bacon & Thomas PLLC

(57) ABSTRACT

An assembly structure of an adapter. The assembly structure of an adapter includes a printed circuit board (PCB) having contacts thereon, a first insulation casing, a second insulation casing assembled with the first insulation casing and having a space for installing the PCB therein, and a plug disposed on the first insulation casing and having conductive terminals and metal extending pieces. Each of the conductive terminals is connected with a corresponding metal extending piece, so that the metal extending pieces contact with the contacts of the PCB to conduct the conductive terminals with the PCB when the first insulation casing, the second insulation casing and the PCB are assembled together.

16 Claims, 7 Drawing Sheets

ASSEMBLY STRUCTURE OF ADAPTER HAVING CONDUCTIVE TERMINAL WITH METAL EXTENDING PORTION FOR CONDUCTING WITH PCB

FIELD OF THE INVENTION

This invention relates to an assembly structure of an electronic device, and more particularly to an assembly structure of an adapter.

BACKGROUND OF THE INVENTION

The adapter, such as the power adapter of the notebook or the charger of the mobile phone, is an electronic device used frequently in daily life. The power adapter or the charger is generally employed for rectifying and converting the commercially available AC power into direct current (DC) power, so as to supply the required power to operate or charge the electronic appliance. Please refer to FIG. 1, which shows the conventional assembly structure of the adapter. The adapter 1 includes a casing 11, a plug 12, a printed circuit board (PCB) 13 and electric wires 14. The casing 11 includes a first insulation casing 111 and a second insulation casing 112. The plug 12 is disposed on the first insulation casing 111. The PCB 13 has various electronic elements thereon for performing different functions according to requirements of the user. In addition, the electric wires 14 are used to connect the conducive terminals 121 of the plug 12 with the PCB 13, thereby the PCB 13 can receive the external power via the conductive terminals 121 of the plug 12 and the electric wires 14 to perform the function of the adapter 1.

There is a tendency to miniaturize various electronic device. It is no exception to the adapter. However, the conventional adapter 1 as shown in FIG. 1 employs the electric wires 14 to connect the conducive terminals 121 of the plug 12 and the PCB 13, therefore the electric wires 14 must be long enough so that both ends of the electric wires 14 can be firmly welded on the PCB 13 and the conducive terminals 121 of the plug 12. In such way, the electric wires 14 take up a lot of space in the interior of the adapter 1 which results in the limitation of reducing the volume of the adapter 1.

Moreover, the electric wire 14 is connected to one end of the conductive terminal 121 of the plug 12 and the contact of the PCB 13 by welding. The welding process includes the following steps. First, one end of the electric wire 14 is welded or tied on the hole 1210 of the conductive terminal 121 of the plug 12. Subsequently, the other end of the electric wire 14 is welded on the contact of the PCB 13. Then the first insulation casing 111 and the second insulation casing 112 are assembled to complete the assembly process. However, the second insulation casing 112 is usually a casing having five adjacent faces, so the welding action is hard to perform and the welding result is hard to check. Therefore, the product may exist defects due to the bad welding. In addition, during the welding process, the extreme heat will be conducted to the first insulation casing 111 via the conductive terminals 121, which may result in the damage of the first insulation casing 111 and affect the securing strength of the conductive terminals 121 to the first insulation casing 111, and even deform the first insulation casing 111. Accordingly, the welding process of the conventional adapter 1 causes the assembling process of the adapter to be time-consuming and laborious, and may produce the adapter with bad quality.

Furthermore, after assembling, the redundant portion of the electric wire 14 between the welded terminals is rolled within the small space of the adapter 1, and will unavoidably touch or contact the electronic elements on the PCB 13. Consequently, the electronic elements may be out of work due to the jostle of the electric wire 14. In addition, a short circuit may occur when the electric wire 14 is jostled in the assembly process and becomes ill-insulating, or the electric wire 14 itself has a defect of ill-insulating.

Therefore, it needs to provide an assembly structure of the adapter which is capable of being assembled easily and efficiently, and can conform to the trend of miniaturization of the adapter.

SUMMARY OF THE INVENTION

It is an object of the present invention to provide an assembly structure of an adapter which economizes the internal space of the adapter and reduces the overall volume of the adapter.

It is another object of the present invention to provide an assembly structure of an adapter which simplifies the connection between the conductive terminals and the PCB, and makes the assembly process of the adapter easier and more convenient.

It is an additional object of the present invention to provide an assembly structure of an adapter which almost directly connects the conductive terminals and the PCB, and greatly decreases the route between the conductive terminals and the PCB, and further provides a safe and reliable assembly structure of an adapter.

In accordance with an aspect of the present invention, the assembly structure of an adapter includes a printed circuit board (PCB) having plural contacts thereon, a first insulation casing, a second insulation casing assembled with the first insulation casing and having a space for installing the PCB therein, and a plug disposed on the first insulation casing and having plural conductive terminals and plural metal extending pieces, wherein each of the conductive terminals is connected with a corresponding metal extending piece. Thereby the metal extending pieces contact with the contacts of the PCB to conduct the conductive terminals with the PCB when the first insulation casing, the second insulation casing and the PCB are assembled together.

In accordance with another aspect of the present invention, the assembly structure of an adapter includes a first insulation casing having a plug and a space therein, wherein the plug has plural conductive terminals and plural metal extending pieces, each of the conductive terminals is connected with a corresponding metal extending piece, and each of the metal extending pieces has a fixed end disposed in the space, a printed circuit board (PCB) having plural contacts thereon and installed in the space, wherein the plural contacts are connected with the metal extending pieces, and a second insulation casing assembled with the first insulation casing for forming the space to a close space.

In accordance with an additional aspect of the present invention, the assembly structure of an adapter includes a printed circuit board (PCB) having plural contacts thereon, a first insulation casing, a second insulation casing assembled with the first insulation casing to form a close space for installing the PCB therein, and a plug disposed on the first insulation casing and having plural conductive terminals, wherein a free end of each of the conductive terminals has two clipping pieces, and at least one the clipping piece has a protruding portion. Thereby the protruding portion of the conductive terminal conducts with the contact of the PCB when the first insulation casing, the second insulation casing and the PCB are assembled together.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 5(*b*) is a schematic view showing the assembly structure of the adapter according to an additional preferred embodiment of the present invention;

DETAILED DESCRIPTION OF THE PREFERRED EMBODIMENT

Figure 1:
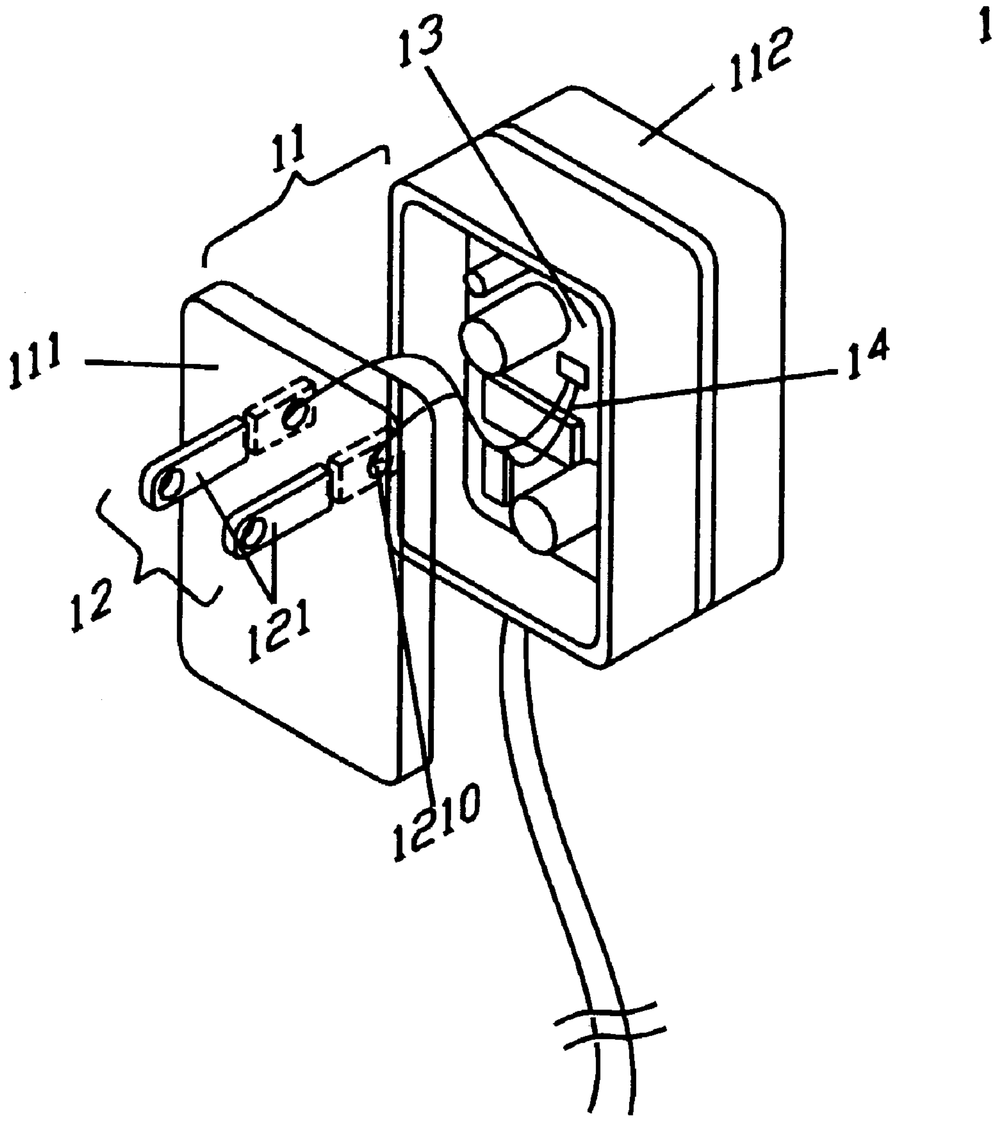
Fig. 1 (PRIOR ART)
FIG. 1 is a schematic view showing the conventional assembly structure of the adapter.
Figure 2:
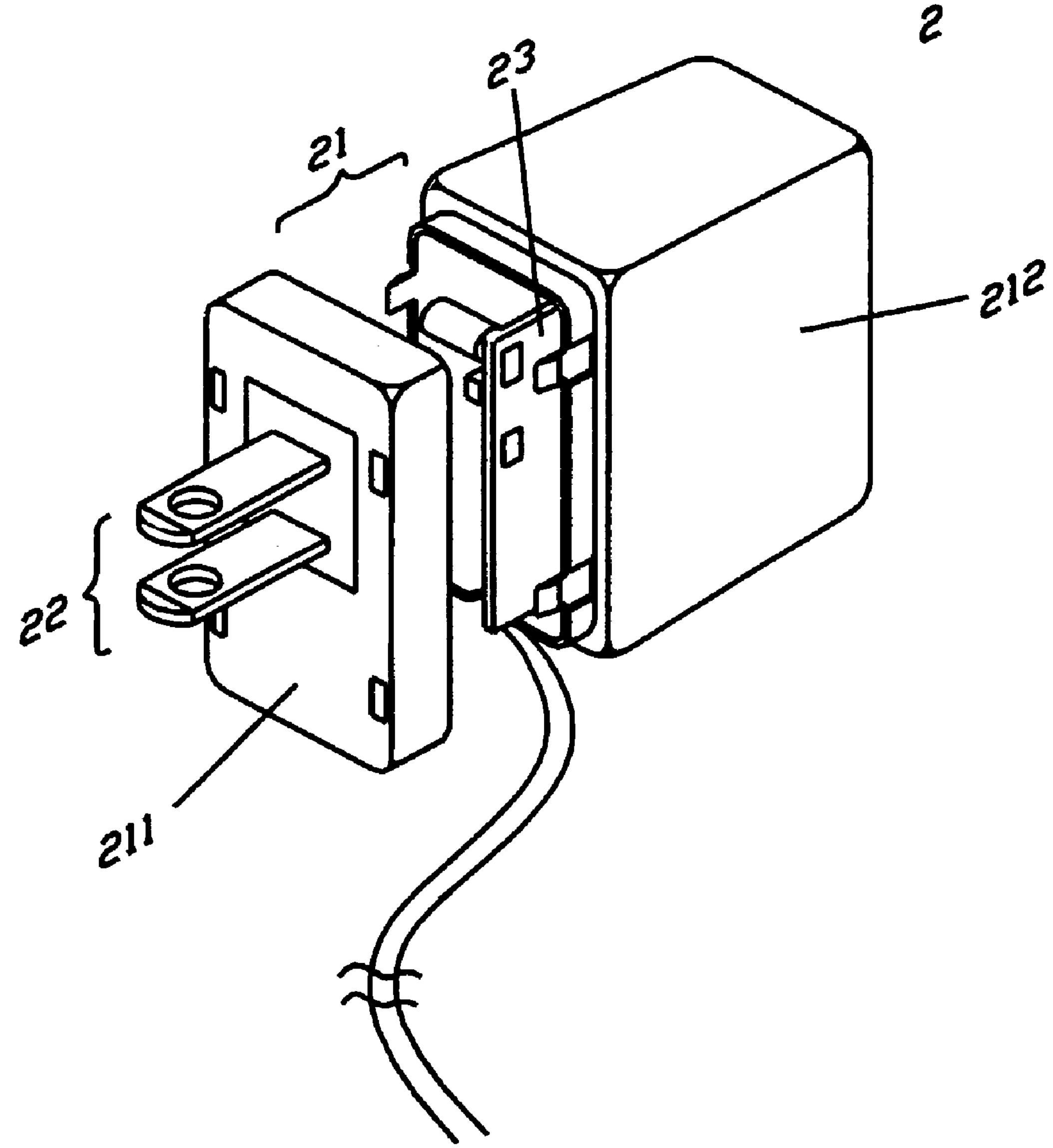
FIG. 2 is a schematic view showing the assembly structure of the adapter according to a preferred embodiment of the present invention.

Please refer to FIG. 2 showing the assembly structure of the adapter according to a preferred embodiment of the present invention. The adapter 2 of the present invention includes a casing 21, a plug 22 and a printed circuit board (PCB) 23. The casing 21 includes a first insulation casing 211 and a second insulation casing 212. The first insulation casing 211 and the second insulation casing 212 are assembled by engagement, sliding engagement or ultrasonic welding. Since such techniques are well known to one skilled in the art, they are not described in detail here. In this embodiment, the first insulation casing 211 is an insulation side plate, and the second insulation casing 212 has five plates for forming a space to install the PCB 23 therein. Of course, in other embodiments, the first insulation casing 211 can also have five plates as that of the second insulation casing 212 shown in FIG. 2.

Figure 3:
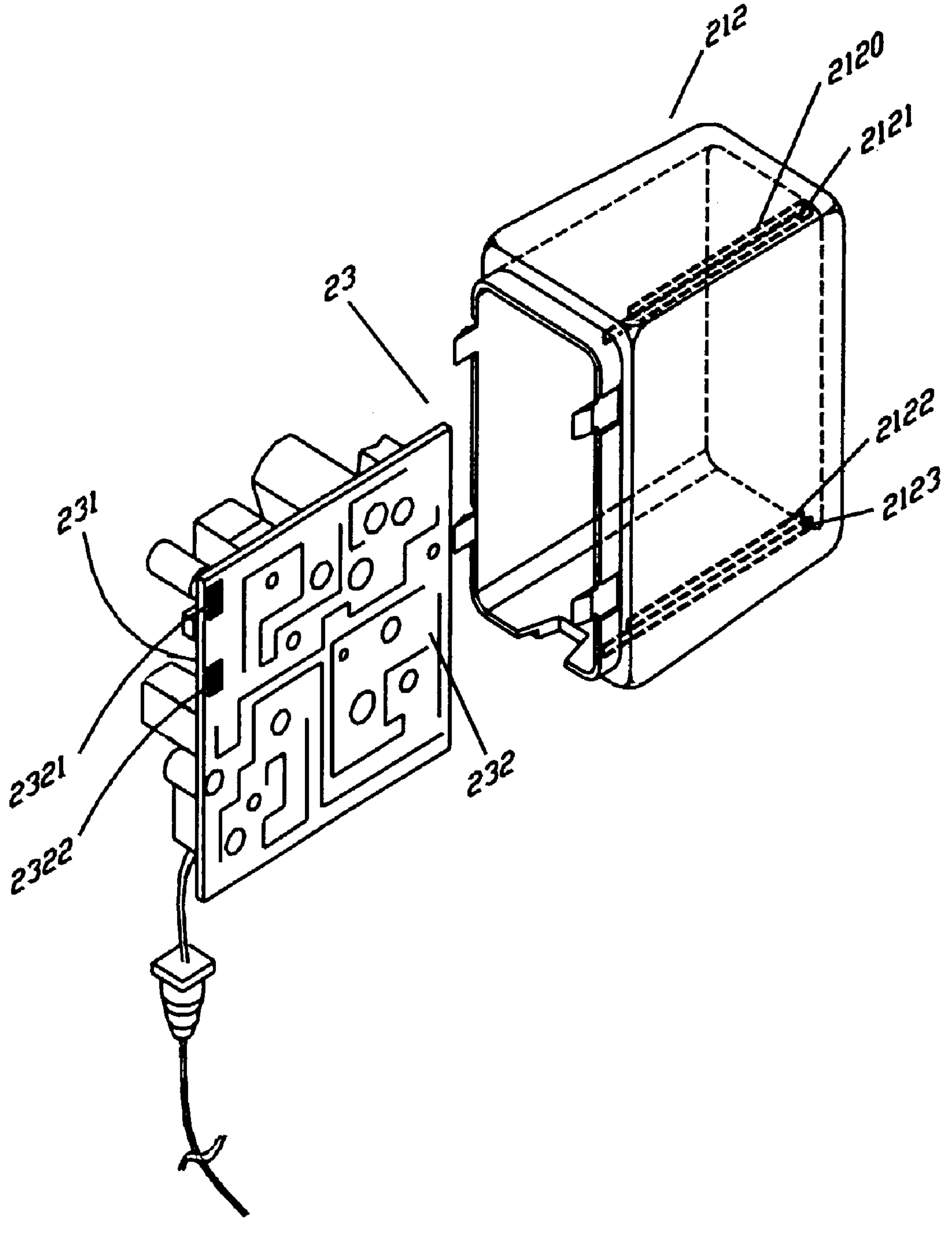
FIG. 3 is a schematic view showing the assembly structure of the second insulation casing and the PCB of the adapter in FIG. 2.

Please refer to FIG. 3 showing the assembly structure of the second insulation casing 212 and the PCB 23 of the adapter 2 in FIG. 2. The second insulation casing 212 has plural parallel ribs 2120, 2121, 2122 and 2123 therein. Each pair of the parallel ribs (2120 with 2121 and 2122 with 2323) form a trench respectively for receiving the PCB 23 in the second insulation casing 212. The PCB 23 has a first surface 231 and a second surface 232, and plural electronic elements can be disposed on the first surface 231 according to the function of the adapter 2. In addition, the PCB 23 has plural contacts 2321 and 2322 which can be selectively disposed on the first surface 231 or the second surface 232 to conduct with the conductive terminals 221 (as shown in FIG. 4) of the plug 22.

Figure 4:
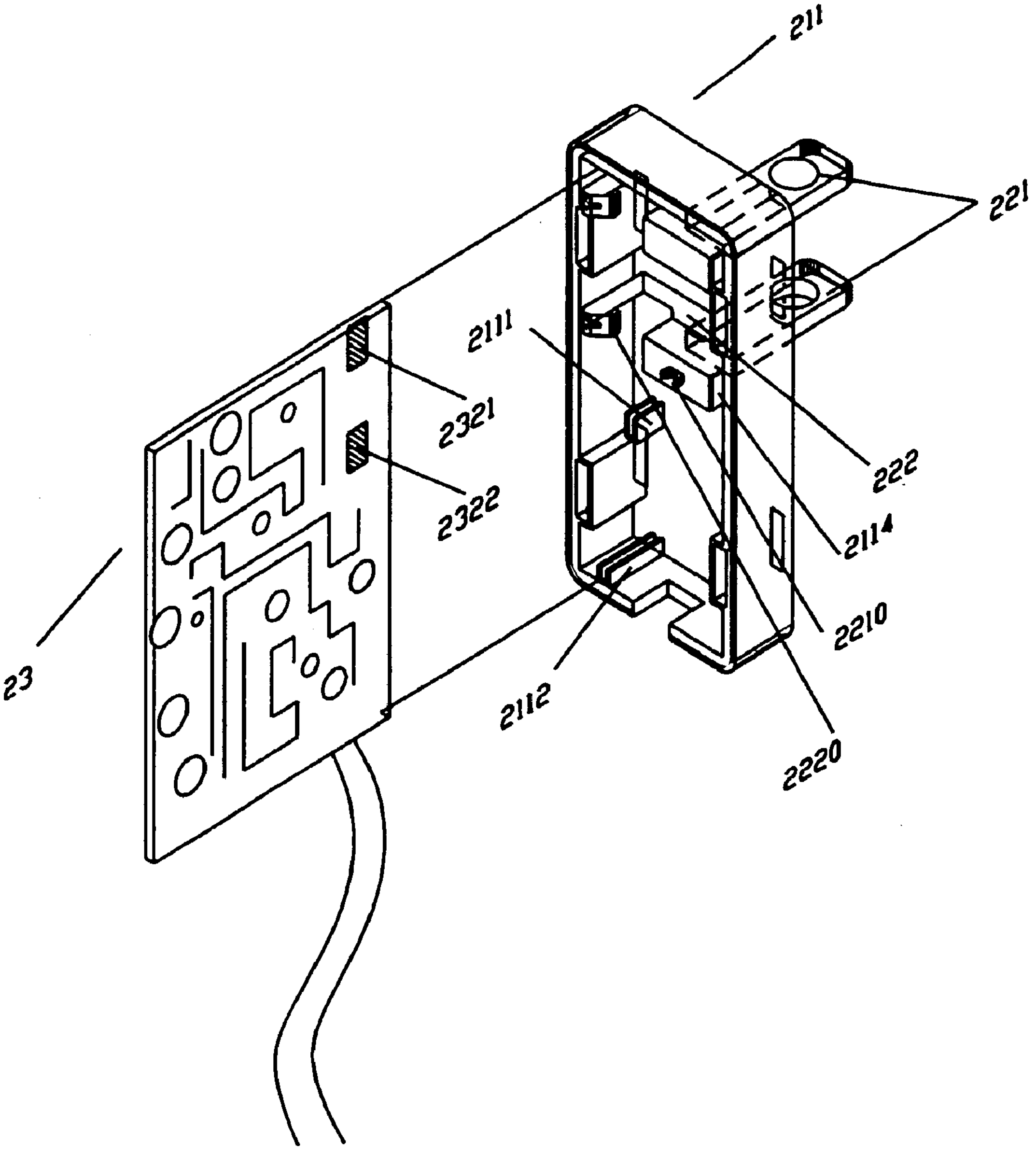
FIG. 4 is a schematic view showing the assembly structure of the first insulation casing, the plug and the PCB of the adapter in FIG. 2.

Please refer to FIG. 4 showing the assembly structure of the first insulation casing 211, the plug 22 and the PCB 23 of the adapter 2 in FIG. 2. The plug 22 is disposed on the first insulation casing 211, and has plural conductive terminals 221 and plural metal extending pieces 222. Preferably, the metal extending piece 222 is a resilient piece. In this embodiment, the arrangement of the conductive terminals 221 is parallel to the long side of the first insulation casing 211, and each of the conductive terminals 221 partially passes through the first insulation casing 211 and connects with the corresponding metal extending piece 222. The connection manner of the conductive terminal and the metal extending piece is that one end of the conductive terminal 221 sequentially passes through the hole (not shown) of the fist insulating casing 211 and the hole (not shown) of the metal extending piece 222, and then the exposed conductive terminal 221 is stamped to form a V-shaped portion 2210. By expanding and supporting of the V-shaped portion 2210, the conductive terminal 221 and the metal extending piece 222 are connected, and the metal extending piece 222 can be stably fixed on a protruding lump 2114 of the first insulation casing 211.

The protruding lump 2114 is used to set the metal extending piece 222 up so as to provide a space for the resilient action of the metal extending piece 222. In addition, the free end of each of the metal extending pieces 222 has a curved portion 2220 for directly contacting with the contact 2321 or 2322 of the PCB 23, thereby conducting the conductive terminals 221 with the PCB 23.

Please refer to FIGS. 2 and 4 again. The first insulation casing 211 has plural pairs of fixing ribs 2111 and 2112 therein for fixing one side of the PCB 23. Therefore, the PCB 23 is first installed in the second insulation casing 212 and further fixed in the fixing ribs 2111 and 2112 of the first insulation casing 212 when the first insulation casing 211 and the second insulation casing 212 are assembled. In the meantime, the curved portion 2220 of each of the metal extending pieces 222 tightly contacts the corresponding contact 2321 or 2322 of the PCB 23. Thereby, when the adapter 2 is assembled, each of the conductive terminals 221 of the plug 22 can be conducted with the contact of the PCB 23 via the metal extending piece 222.

Figure 5A:
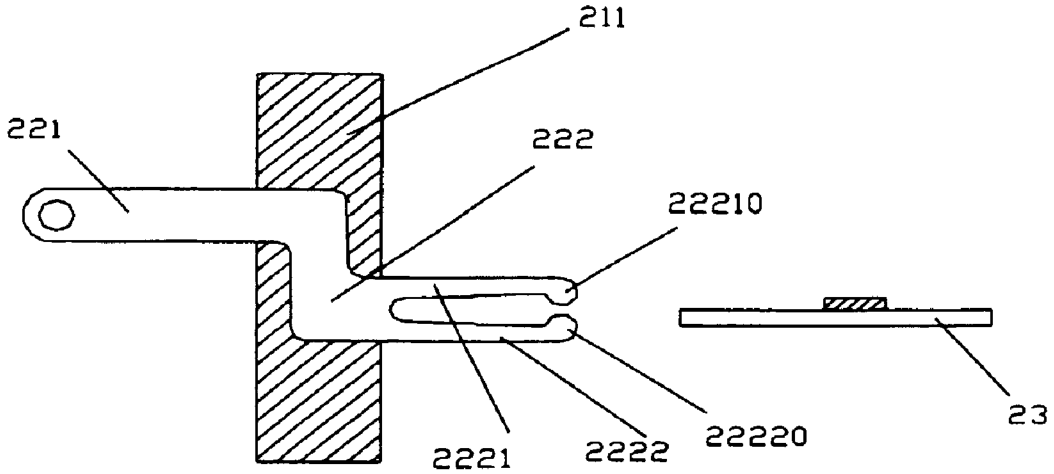
FIG. 5(*a*) is a schematic view showing the assembly structure of the adapter according to another preferred embodiment of the present invention.
Figure 5B:
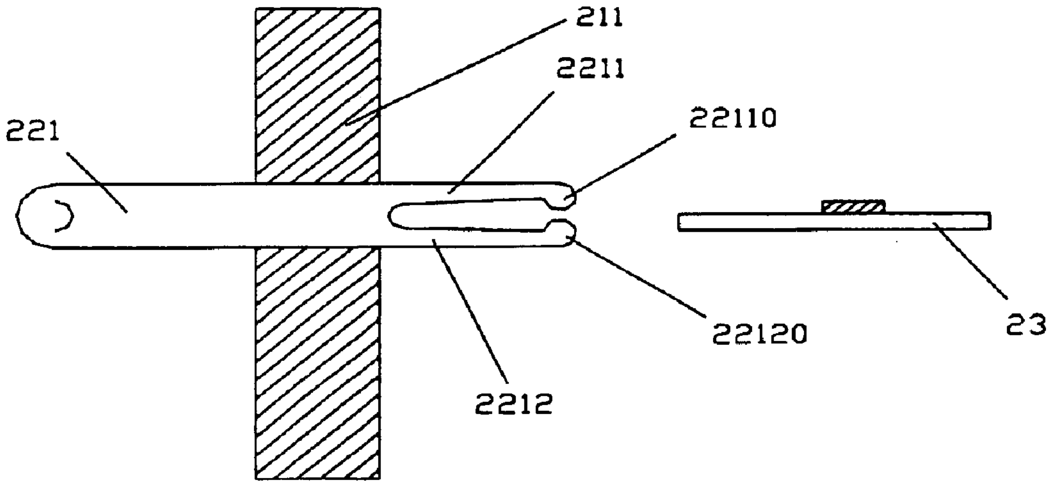

Of course, except the connection manner described above, the conductive terminal 221 can be integrally formed with the metal extending piece 222 as shown in FIG. 5(*a*). In this embodiment, the conductive terminal 221 is integrally formed with the metal extending piece 222 at a curved angle, and disposed in the first insulation casing 211. The free end of the metal extending piece 222 has two clipping pieces 2221 and 2222, and each of the clipping pieces has a protruding portion 22210 or 22220 on the terminal thereof. When the first insulation casing 211, the second insulation casing 212 and the PCB 23 are assembled together, one side of the PCB 23 is inserted in a slit between the two clipping pieces 2221 and 2222, and fixed by the two clipping pieces 2221 and 2222 and the fixing ribs 2111 and 2112 of the first insulation casing 211 (not shown in FIG. 5(*a*)). In the meantime, the protruding portions 22210 and 22220 of the clipping pieces 2221 and 2222 can tightly clip and contact the corresponding contact of the PCB 23. Thereby, when the adapter 2 is assembled, each of the conductive terminals 221 of the plug 22 can be conducted with the contact of the PCB 23 via the metal extending piece 222.

In addition, in another embodiment of the present invention, two clipping pieces 2211 and 2212 can be formed directly on the terminal of the conductive terminal 221 as shown in FIG. 5(*b*). The free end of each of the clipping pieces 2211 and 2212 has a protruding portion 22110 or 22120. When the first insulation casing 211, the second insulation casing 212 and the PCB 23 are assembled together, one side of the PCB 23 is inserted in a slit between the two clipping pieces 2211 and 2212, and fixed by the two clipping pieces 2211 and 2212 and the fixing ribs 2111 and 2112 of the first insulation casing 211. In the meantime, the protruding portions 22110 and 22120 of the clipping pieces 2211 and 2212 can tightly clip and contact the corresponding contact of the PCB 23. Thereby, when the adapter 2 is assembled, each of the conductive terminals 221 of the plug 22 can be conducted with the contact of the PCB 23.

Figure 6:
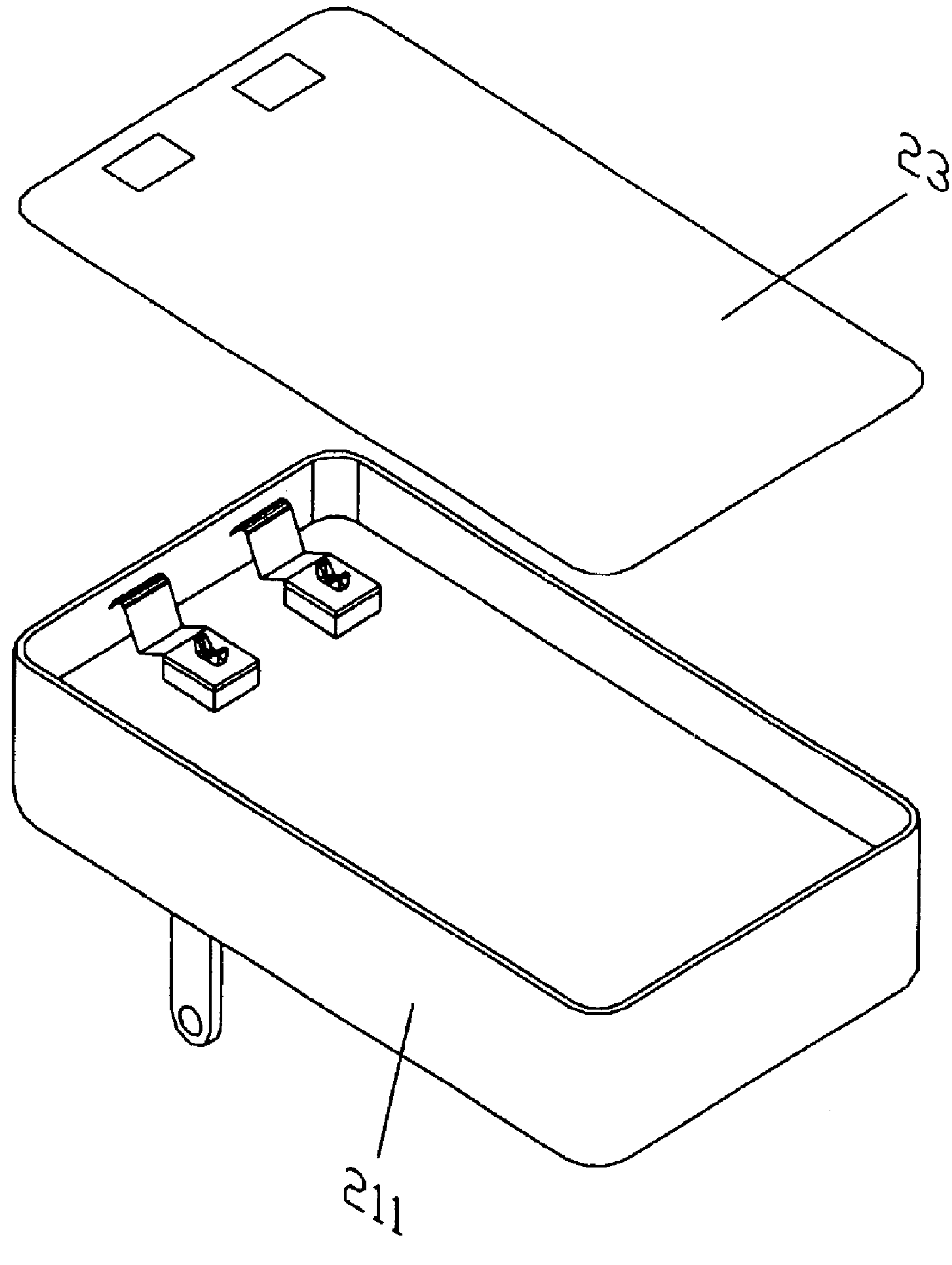
FIG. 6 is a schematic view showing the assembly structure of the adapter according to a further preferred embodiment of the present invention.
Figure 7:
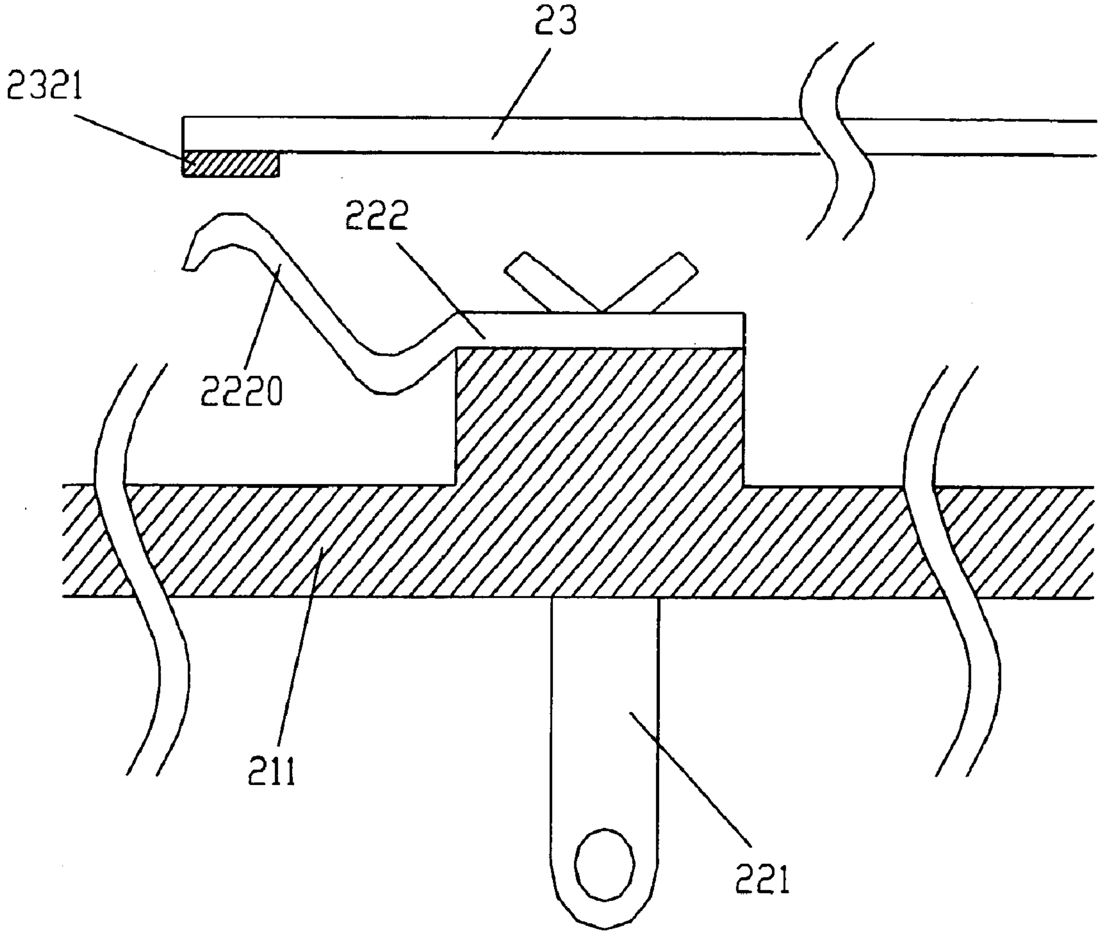
FIG. 7 is a schematic view showing the assembly structure of the first insulation casing, the plug and the PCB of the adapter in FIG. 6.

Please refer to FIG. 6 showing the assembly structure of the adapter according to a further preferred embodiment of the present invention. In this embodiment, the PCB 23 is lain and crossly set in the space of the first insulation casing 211. The conductive terminals 221 of the plug 22 are disposed on the first insulation casing 211, and the arrangement of the conductive terminals 221 is parallel to the short side of the first insulation casing 211. In addition, the connection and fixing manners of the conductive terminals 221 and the metal extending pieces 222 of the plug 22 and the first insulation casing 211 as shown in FIG. 7 are the same as that of the above embodiments (i.e. the fixing end of the metal extending piece 222 is disposed in the first insulation casing 211). Therefore, they are not described in detail again. When the PCB 23 is lain in the first insulation casing 211, and then the first insulation casing 211 and the second insulation casing 212 are assembled to form a close space, the curved portion 2220 of each of the metal extending pieces 222 can tightly contact the corresponding contact 2321 of the PCB 23. Thereby, when the adapter 2 is assembled, each of the conductive terminals 221 of the plug 22 can be conducted with the contact 2321 of the PCB 23 via the metal extending piece 222. Accordingly, no matter the PCB 23 is inserted in the space of the first insulation casing 211 or the second insulation casing 212, or lain in the space of the first insulation casing 211 and the second insulation casing 212, the metal extending piece 222 can contact the contact on the first surface 231 or the second surface 232 of the PCB 23 by the curved portion with different curved angle design when the first insulation casing 211 and the second insulation casing 212 are assembled. Therefore, the assembly structure of the adapter 2 in the present invention is easy and simple.

The above embodiments are illustrated with the assembly structure of the power adapter, but the assembly techniques of the adapter in the present invention are not limited to apply to the power adapter. For example, the assembly techniques described above can also be applied to the charger and the transformer. In addition, the number of the conductive terminals of the plug is not limited to two, and the arrangement and the number of the conductive terminals can be varied in correspondence to the different standards of different countries.

In conclusion, the present invention provides an assembly structure of the adapter which almost directly connects the conductive terminals and the PCB, and greatly decreases the route between the conductive terminals and the PCB, and further provides a safe and reliable assembly structure. Therefore, the present invention exhibits a great industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembly structure of an adapter, comprising:

a printed circuit board (PCB) having plural contacts thereon;

a first insulation casing;

a second insulation casing assembled with said first insulation casing and having a space for installing said PCB therein;

a plug disposed on said first insulation casing and having plural conductive terminals and plural metal extending pieces, wherein each of said conductive terminals passes through a corresponding one of said metal extending pieces and forms a V-shaped portion to connect with the corresponding one of said metal extending pieces; and thereby said metal extending pieces contact with said contacts of said PCB to conduct said conductive terminals with said PCB when said first insulation casing, said second insulation casing and said PCB are assembled together.

2. The assembly structure according to claim 1 wherein said first insulation casing and said second insulation casing are assembled by engagement, sliding engagement or ultrasonic welding.

3. The assembly structure according to claim 1 wherein said first insulation casing is an insulation side plate, and said second insulation casing has five plates for forming said space.

4. The assembly structure according to claim 1 wherein said second insulation casing has plural parallel ribs, and each pair of said parallel ribs forms a trench for receiving said PCB in said second insulation casing.

5. The assembly structure according to claim 1 wherein said plural contacts are disposed on a surface of said PCB.

6. The assembly structure according to claim 1 wherein each of said conductive terminals partially passes through said first insulation casing and connects with one of said metal extending pieces.

7. The assembly structure according to claim 6 wherein each of said metal extending pieces is fixed on a protruding lump of said first insulation casing, thereby providing a space for resilient action of said metal extending piece.

8. The assembly structure according to claim 1 wherein each of said metal extending pieces has a curved portion for contacting with said contacts of said PCB.

9. The assembly structure according to claim 1 wherein said first insulation casing has plural pairs of fixing ribs therein for fixing said PCB.

10. The assembly structure according to claim 1 wherein one free end of said metal extending piece has two clipping pieces, and each of said clipping pieces has a protruding portion on the terminal.

11. The assembly structure according to claim, 10 wherein when said first insulation casing, said second insulation casing and said PCB are assembled together, one side of said PCB is inserted in a slit between said two clipping pieces, so that said protruding portions of said metal extending piece tightly clip and contact a corresponding contact of said PCB.

12. An assembly structure of an adapter, comprising:

a first insulation casing having a plug and a space therein, wherein said plug has plural conductive terminals and plural metal extending pieces, each of said conductive terminals is connected with one of said metal extending pieces, and each of said metal extending pieces has a fixed end disposed in said space and a free end having two clipping pieces, wherein each of said clipping pieces has a protruding portion on the terminal thereof;

a printed circuit board (PCB) having plural contacts thereon and installed in said space, wherein said plural contacts are connected with said protruding portions of said metal extending pieces; and a second insulation casing assembled with said first insulation casing for enclosing said space.

13. The assembly structure according to claim 12 wherein each of said metal extending pieces is a resilient piece.

14. The assembly structure according to claim 12 wherein each of said conductive terminals is integrally formed with one of said metal extending pieces.

15. The assembly structure according to claim 14 wherein each of said conductive terminals is integrally formed with one of said metal extending pieces at a curved angle, and disposed in said first insulation casing.

16. An assembly structure of an adapter, comprising:

a printed circuit board (PCB) having plural contacts thereon;

a first insulation casing;

a second insulation casing assembled with said first insulation casing to form a closed space for installing said PCB therein; and a plug disposed on said first insulation casing and having plural conductive terminals, wherein a free end of each of said conductive terminals has two clipping pieces, and at least one of said clipping pieces has a protruding portion, thereby said protruding portion of said conductive terminal conducts with said contact of said PCB when said first insulation casing, said second insulation casing and said PCB are assembled together.

* * * * *